(12) United States Patent
Inada et al.

(10) Patent No.: US 12,424,415 B2
(45) Date of Patent: Sep. 23, 2025

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Tetsuaki Inada, Toyama (JP); Takayuki Sato, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 236 days.

(21) Appl. No.: 18/172,081

(22) Filed: Feb. 21, 2023

(65) Prior Publication Data

US 2023/0207277 A1    Jun. 29, 2023

Related U.S. Application Data

(63) Continuation of application No. PCT/JP2020/035435, filed on Sep. 18, 2020.

(51) Int. Cl.
*H01J 37/32* (2006.01)
(52) U.S. Cl.
CPC ..... *H01J 37/32449* (2013.01); *H01J 37/3211* (2013.01)
(58) Field of Classification Search
CPC .......................... H01J 37/32449; H01J 37/3211
See application file for complete search history.

(56) References Cited

U.S. PATENT DOCUMENTS

| | | | |
|---|---|---|---|
| 5,522,934 A | 6/1996 | Suzuki et al. | |
| 2007/0074814 A1* | 4/2007 | Hahn | H01L 21/67207 156/345.31 |

(Continued)

FOREIGN PATENT DOCUMENTS

| | | |
|---|---|---|
| CN | 110730999 A | 1/2020 |
| JP | 10-219457 A | 8/1998 |

(Continued)

OTHER PUBLICATIONS

Taiwan Office Action, Application No. 110131788, dated Jun. 21, 2022. 16 pages.

(Continued)

*Primary Examiner* — Henry Luong
(74) *Attorney, Agent, or Firm* — Volpe Koenig

(57) ABSTRACT

According to one aspect of the technique of the present disclosure, there is provided a substrate processing apparatus including: a process vessel constituting a process chamber; a first gas supplier provided with a first supply port through which a first process gas is supplied; a second gas supplier provided with a second supply port through which a second process gas is supplied; a plasma generator provided along an outer circumference of the process vessel and configured to be capable of plasma-exciting the first process gas supplied into the process chamber; and a substrate mounting table on which a substrate is placed. The second supply port is provided at a supply pipe extending downward from a position in a ceiling surface of the process chamber located closer to a radial center of the process vessel than the first supply port, and is provided below the first supply port.

19 Claims, 8 Drawing Sheets

(56) References Cited

U.S. PATENT DOCUMENTS

| | | | |
|---|---|---|---|
| 2007/0187363 A1* | 8/2007 | Oka .................. | H01J 37/32449 156/345.33 |
| 2007/0251918 A1* | 11/2007 | Bera ................. | H01J 37/32449 216/58 |
| 2011/0048325 A1 | 3/2011 | Choi et al. | |
| 2011/0198417 A1 | 8/2011 | Detmar et al. | |
| 2016/0056035 A1 | 2/2016 | Toyoda et al. | |
| 2018/0358204 A1 | 12/2018 | Ma et al. | |
| 2019/0006481 A1 | 1/2019 | Nakayama et al. | |

FOREIGN PATENT DOCUMENTS

| | | | |
|---|---|---|---|
| JP | 2003077893 A | * | 3/2003 |
| JP | 2012-519956 A | | 8/2012 |
| KR | 10-0300097 | | 11/2001 |
| KR | 10-2012-0139741 | | 12/2012 |
| KR | 10-2013-0081369 A | | 7/2013 |
| KR | 10-2016-0024713 | | 3/2016 |
| KR | 10-2018-0110030 | | 10/2018 |
| WO | 2017/154245 A1 | | 9/2017 |

OTHER PUBLICATIONS

Japanese Office Action issued on Jun. 19, 2023 for Japanese Patent Application No. 2022-550286.
ISA State Intellectual Property Office of the People's Republic of China, First Office Action of the International Searching Authority Issued on Feb. 17, 2025 for Chinese Patent Application No. 202080103019.2.
Korean Office Action issued on Mar. 19, 2025 for Korean Patent Application No. 10-2023-7005701.

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This application is a bypass continuation application of PCT International Application No. PCT/JP2020/035435, filed on Sep. 18, 2020, in the WIPO, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Related Art

When forming a pattern of a semiconductor device such as a flash memory, a step of performing a predetermined process such as an oxidation process and a nitridation process on a substrate may be performed as a part of a manufacturing process of the semiconductor device.

For example, according to some related arts, a surface of the pattern formed on the substrate is modified by using a process gas which is plasma-excited. A gas supplier (which is a gas supply structure or a gas supply system) is provided at an upper portion of a process chamber. The gas supplier is configured such that a gas such as the process gas (or a reactive gas) is supplied into the process chamber through the gas supplier.

According to some related arts described above, the gas (for example, a single type of gas or a plurality of types of pre-mixed gases) is supplied through a gas outlet port of the gas supplier at a constant gas concentration. Then, the gas is plasma-excited and supplied to the substrate. However, even when the process gas is diffused in the process chamber with a uniform gas concentration, depending on a distribution of a plasma generated in the process chamber, it may not be possible to obtain a desired distribution in a surface of the substrate by performing a plasma processing.

SUMMARY

According to the present disclosure, there is provided a technique capable of obtaining a desired distribution in a surface of a substrate by performing a plasma processing.

According to one aspect of the technique of the present disclosure, there is provided a substrate processing apparatus including: a process vessel constituting a process chamber; a first gas supplier provided with a first supply port through which a first process gas is supplied into the process chamber; a second gas supplier provided with a second supply port through which a second process gas is supplied into the process chamber; a plasma generator provided along an outer circumference of the process vessel, constituted by an electrode to which a high frequency power is supplied, and configured to be capable of plasma-exciting the first process gas supplied into the process chamber; and a substrate mounting table on which a substrate is placed, wherein the second supply port is provided at a supply pipe extending downward from a position in a ceiling surface of the process chamber located closer to a radial center of the process vessel than the first supply port, and the second supply port is provided below the first supply port.

DETAILED DESCRIPTION

Embodiments of Present Disclosure

Figure 1:
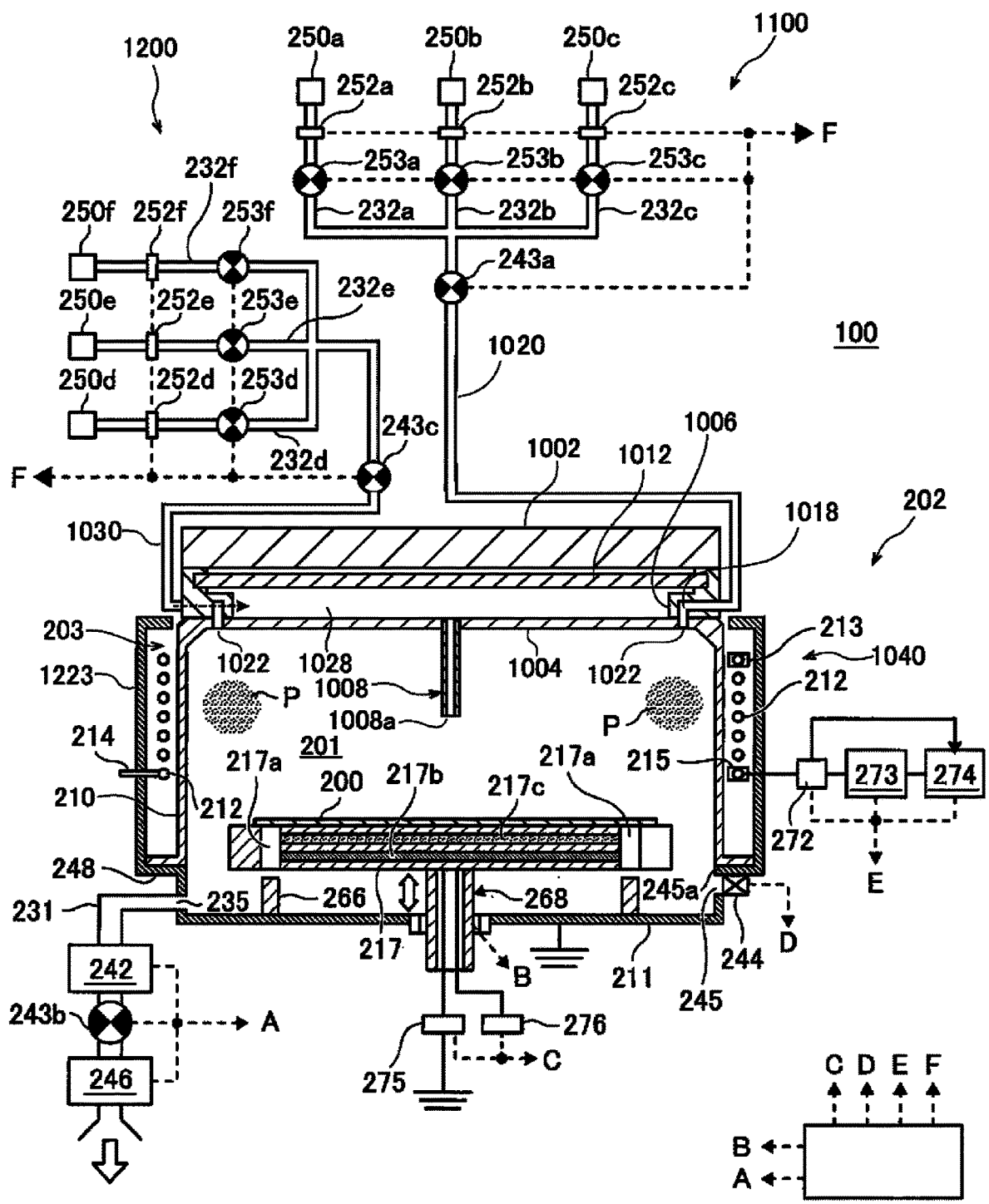
FIG. 1 is a diagram schematically illustrating a cross-section of a substrate processing apparatus according to one or more embodiments of the present disclosure in a case where an ICP (Inductively Coupled Plasma) electrode is used to generate a plasma.

Hereinafter, one or more embodiments (hereinafter, also simply referred to as "embodiments") according to the technique of the present disclosure will be described with reference to the drawings. In the following descriptions of the embodiments, the same or similar reference numerals represent the same or similar components in the drawings, and redundant descriptions related thereto will be omitted. In addition, the drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

Hereinafter, a configuration of a substrate processing apparatus 100 according to the present embodiments will be described with reference to FIG. 1. For example, the substrate processing apparatus 100 according to the present embodiments is configured to perform a process such as an oxidation process on a film formed on a surface of a substrate (that is, a wafer 200 described later). The substrate processing apparatus 100 includes a process vessel 203, a first gas supplier (which is a first gas supply structure or a first gas supply system) 1100, a second gas supplier (which is a second gas supply structure or a second gas supply system) 1200, a plasma generator (which is a plasma generating structure) 1040 and a susceptor 217 serving as a substrate mounting table (or a substrate support).

<Process Chamber>

The substrate processing apparatus 100 includes a process furnace 202 in which the wafer 200 serving as the substrate is processed by using a plasma. The process furnace 202 is provided with the process vessel 203 constituting a process chamber 201. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined. For example, the upper vessel 210 is made of a non-metallic material such as aluminum oxide ($Al_2O_3$) and quartz ($SiO_2$), and the lower vessel 211 is made of a metal such as aluminum (Al).

For example, a ceiling surface of the process chamber 201 (in other words, a ceiling surface of the upper vessel 210) is constituted by a plate 1004. A lid 1012 whose lower surface faces an upper surface of the plate 1004 is provided above the plate 1004.

In addition, a gate valve 244 is provided on a lower side wall of the lower vessel 211. While the gate valve 244 is open, the wafer 200 can be transferred (loaded) into the process chamber 201 through a loading/unloading port 245 using a transfer structure (transfer device) (not shown) or can be transferred (unloaded) out of the process chamber 201 through the loading/unloading port 245 using the transfer structure. While the gate valve 244 is closed, the gate valve 244 maintains the process chamber 201 airtight.

For example, the process chamber 201 includes a plasma generation space 201a and a substrate processing space 201b. A resonance coil 212 is provided around the plasma generation space 201a. The substrate processing space 201b communicates with the plasma generation space 201a, and the wafer 200 is processed in the substrate processing space 201b. The plasma generation space 201a refers to a space in which the plasma is generated, for example, a space above a lower end of the resonance coil 212 and below an upper end of the resonance coil 212 in the process chamber 201. In addition, the substrate processing space 201b refers to a space in which the substrate (that is, the wafer 200) is processed by the plasma, for example, a space below the lower end of the resonance coil 212. According to the present embodiments, a horizontal diameter of the plasma generation space 201a in a horizontal direction is set to be substantially the same as a horizontal diameter of the substrate processing space 201b in the horizontal direction.

<Susceptor>

The susceptor 217 is provided at a center of a bottom portion of the process chamber 201. The susceptor 217 constitutes the substrate mounting table (or the substrate support) on which the wafer 200 is placed. For example, the susceptor 217 is made of a non-metallic material such as aluminum nitride (AlN), ceramics and quartz.

A heater 217b serving as a heating structure is integrally embedded in the susceptor 217. The heater 217b is configured to heat the wafer 200 such that the surface of the wafer 200 is heated to a temperature, for example, within a range from 25° C. to 750° C. when an electric power is supplied to the heater 217b.

The susceptor 217 is electrically insulated from the lower vessel 211. An impedance adjusting electrode 217c is provided in the susceptor 217. The impedance adjusting electrode 217c is grounded via a variable impedance regulator 275 serving as an impedance adjusting structure. For example, the variable impedance regulator 275 is constituted by components such as a coil (not shown) and a variable capacitor (not shown). The variable impedance regulator 275 is configured to change an impedance of the impedance adjusting electrode 217c by controlling an inductance and resistance of the coil (not shown) and a capacitance value of the variable capacitor (not shown). Thereby, it is possible to control the potential (bias voltage) of the wafer 200 via the impedance adjusting electrode 217c and the susceptor 217. However, according to the present embodiments, it is possible to appropriately select whether or not to perform a bias voltage control by using the impedance adjusting electrode 217c.

A susceptor elevator 268 including a driver (which is a driving structure) capable of elevating and lowering the susceptor 217 is provided at the susceptor 217. In addition, a plurality of through-holes 217a are provided at the susceptor 217, and a plurality of wafer lift pins 266 are provided at a bottom surface of the lower vessel 211 at locations corresponding to the plurality of through-holes 217a. For example, at least three of the through-holes 217a and at least three of the wafer lift pins 266 are provided at positions facing one another. When the susceptor 217 is lowered by the susceptor elevator 268, the wafer lift pins 266 pass through the through-holes 217a.

The substrate mounting table (or the substrate support) according to the present embodiments is constituted mainly by the susceptor 217, the heater 217b and the impedance adjusting electrode 217c.

<First Gas Supplier>

The first gas supplier 1100 serving as the first gas supply structure or the first gas supply system is provided with a first supply port 1022 through which a first process gas is supplied into the process chamber 201. Hereinafter, the gas supplied through the first gas supplier 1100 is also referred to as the "first process gas". The plate 1004 constituting the ceiling surface of the process chamber 201 and the lid 1012 whose lower surface faces the upper surface of the plate 1004 are provided above a center of the process chamber 201. Each of the plate 1004 and the lid 1012 is made of a material capable of transmitting a light, for example, transparent quartz. A lamp heater 1002 capable of heating an inner portion of the process chamber 201 is provided on an upper portion of the lid 1012. The light emitted from the lamp heater 1002 reaches an inside of the process chamber 201 through the lid 1012 and the plate 1004.

A first buffer (which is a first buffer structure) 1018 to which the first process gas is supplied is provided in a region extending along a radially outer periphery of an upper end of the process vessel 203. For example, a manifold 1006 is provided on the process vessel 203, and the first buffer 1018 is provided at the manifold 1006. The first buffer 1018 is of an annular shape, and is provided around the plate 1004. When a substrate processing described later is being performed (that is, when the wafer 200 is being processed), the first buffer 1018, which is an annular space around the plate 1004, is in a decompressed state, and the first process gas is supplied to the first buffer 1018. The first supply port 1022 is in communication with the first buffer 1018, and is provided along a circumferential direction of the process vessel 203. By supplying the first process gas from the first buffer 1018 into the process chamber 201 through the first supply port 1022, it is possible to uniformly supply the first process gas along the circumferential direction of the process vessel 203.

For example, a gaseous mixture of a first gas and a second gas is used as the first process gas. The first gas refers to a gas capable of generating an activated species of oxygen by a plasma excitation, that is, an oxygen-containing gas. For example, at least one selected from the group consisting of oxygen ($O_2$), ozone ($O_3$), water vapor ($H_2O$), hydrogen peroxide ($H_2O_2$) and nitrogen monoxide (NO) or a gaseous mixture thereof may be used as the oxygen-containing gas. The second gas refers to at least one selected from the group consisting of a hydrogen-containing gas and an inert gas. According to the present embodiments, for example, the hydrogen-containing gas is used as the second gas. For example, at least one selected from the group consisting of hydrogen ($H_2$), $H_2O$ and $H_2O_2$ or a gaseous mixture thereof may be used as the hydrogen-containing gas. For example, at least one rare gas selected from the group consisting of helium (He), neon (Ne), argon (Ar), krypton (Kr) and xenon (Xe) and nitrogen ($N_2$) or a gas mixture thereof may be used as the inert gas. Alternatively, the first process gas may refer to a gas containing the first gas and free of the second gas. From the viewpoint of easily adjusting a ratio of oxygen and hydrogen in the first process gas and a second process gas described later, it is preferable to use at least one selected from the group consisting of oxygen ($O_2$) and ozone ($O_3$) as the oxygen-containing gas and hydrogen ($H_2$) as the hydrogen-containing gas.

A downstream end of an oxygen-containing gas supply pipe 232a through which the oxygen-containing gas is supplied, a downstream end of a hydrogen-containing gas supply pipe 232b through which the hydrogen-containing gas is supplied and a downstream end of an inert gas supply pipe 232c through which the inert gas (such as $N_2$ gas) is supplied are connected to a gas introduction path 1020 so as to be conjoined with one another. An oxygen-containing gas supply source 250a, a mass flow controller (MFC) 252a serving as a flow rate controller and a valve 253a serving as an opening/closing valve are sequentially provided at the oxygen-containing gas supply pipe 232a. A hydrogen-containing gas supply source 250b, an MFC 252b and a valve 253b are sequentially provided at the hydrogen-containing gas supply pipe 232b. An inert gas supply source 250c, an MFC 252c and a valve 253c are sequentially provided at the inert gas supply pipe 232c. A valve 243a is provided on a downstream side of a location where the oxygen-containing gas supply pipe 232a, the hydrogen-containing gas supply pipe 232b and the inert gas supply pipe 232c join. The valve 243a is connected to an upstream end of the gas introduction path 1020. It is possible to supply process gases such as the oxygen-containing gas, the hydrogen-containing gas and the inert gas into the process chamber 201 via the oxygen-containing gas supply pipe 232a, the hydrogen-containing gas supply pipe 232b and the inert gas supply pipe 232c by opening and closing the valves 253a, 253b, 253c and 243a while adjusting flow rates of the respective gases by the MFCs 252a, 252b and 252c.

The first gas supplier (which is the first gas supply structure or the first gas supply system) 1100 according to the present embodiments is constituted mainly by the first supply port 1022, the oxygen-containing gas supply pipe 232a, the hydrogen-containing gas supply pipe 232b, the inert gas supply pipe 232c, the MFCs 252a, 252b and 252c and the valves 253a, 253b, 253c and 243a. The first gas supplier 1100 is configured such that a gas containing oxygen and serving as a source of an oxidizing species is supplied into the process chamber 201 through the first gas supplier 1100.

<Second Gas Supplier>

The second gas supplier 1200 serving as the second gas supply structure or the second gas supply system is provided with a nozzle hole 1008a serving as a second supply port through which the second process gas whose composition is different from that of the first process gas is supplied into the process chamber 201. The nozzle hole 1008a is provided at a nozzle 1008 serving as a supply pipe provided so as to extend downward from a center of the plate 1004 constituting the ceiling surface of the process chamber 201. Further, the nozzle hole 1008a is provided below the first supply port 1022. Hereinafter, the gas supplied through the second gas supplier 1200 is also referred to as the "second process gas". As shown in FIG. 1, a second buffer (which is a second buffer structure) 1028 to which the second process gas is supplied is provided between the upper surface of the plate 1004 and the lower surface of the lid 1012. An upper end of nozzle 1008 is connected to the second buffer 1028. By adopting a structure of supplying the second process gas into the process chamber 201 via the second buffer 1028, for example, even when a component such as the lamp heater 1002 is provided above the lid 1012, it is possible to supply the second process gas via the center of the plate 1004 with a simple configuration.

In FIG. 1, the nozzle hole 1008a is provided between an upper end and a lower end of an electrode that constitutes the plasma generator 1040. In addition, the nozzle hole 1008a is provided between an upper end and a lower end of a plasma generation region. The plasma generation region refers to a region where a plasma "P" is generated, and details thereof will be described later. Further, the nozzle hole 1008a may be provided at substantially the same height as a midpoint (electric midpoint) of the resonance coil 212 that constitutes the plasma generator 1040, which will be described later. In other words, the nozzle hole 1008a may be located at the same height as a ring-shaped plasma (that is, the plasma P) generated at the midpoint of the resonance coil 212 of λ or λ/2 wherein A is a wavelength of a high frequency power supplied to the resonance coil 212.

Figure 7:
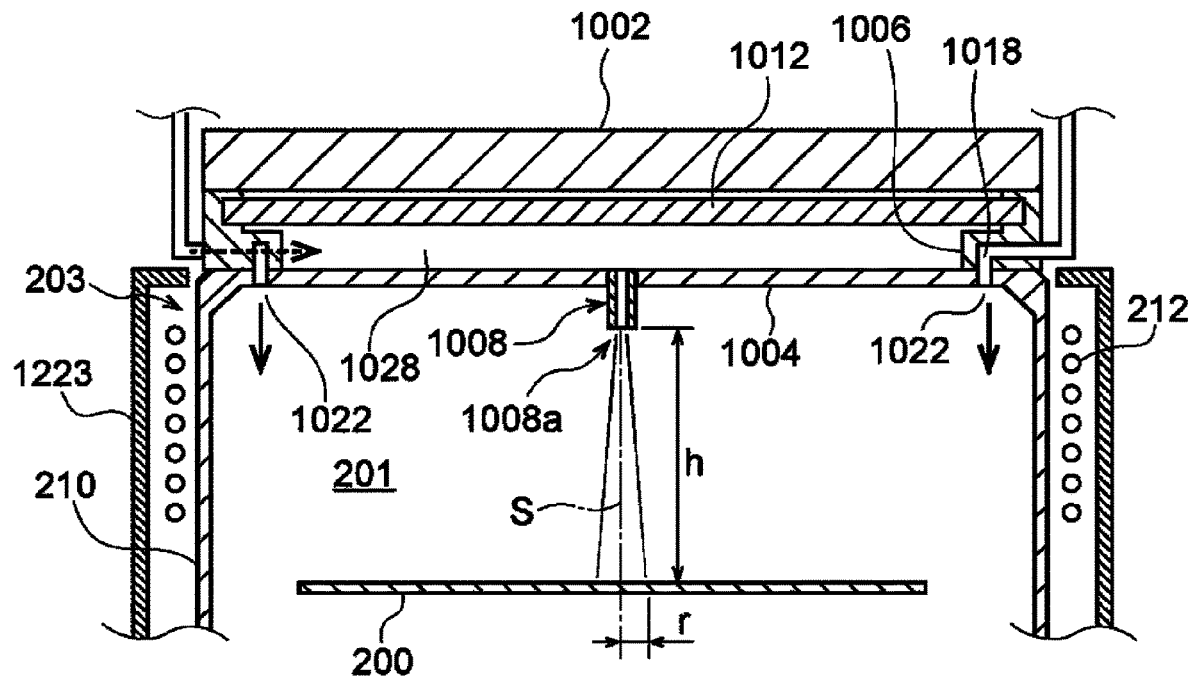
FIG. 7 is a diagram schematically illustrating a cross-section of the substrate processing apparatus according to the embodiments of the present disclosure in a case where the nozzle is provided above a plasma generation region in the substrate processing apparatus.

Alternatively, as shown in FIG. 7, the nozzle hole 1008a may be provided above the upper end of the electrode that constitutes the plasma generator 1040. Further, the nozzle hole 1008a may be provided above the upper end of the plasma generation region.

Further, in FIG. 1, the nozzle hole 1008a is provided so as to be located radially more inward than an inner circumference of the plasma generation region with reference to a radial direction of the process vessel 203. The plasma generation region is of a cylindrical shape or an annular shape, and is provided along an inner circumference of the process vessel 203 in the process chamber 201. The same applies to cases shown in FIGS. 7 and 8. In other words, according to the present embodiments, the nozzle 1008 and the nozzle hole 1008a are provided such that the second process gas can be supplied to a radially inner region with reference to the radial direction of the process vessel 203, which is located more inward than the inner circumference of the plasma generation region (which is of a cylindrical shape or an annular shape and is provided along the inner circumference of the process vessel 203).

Figure 8:
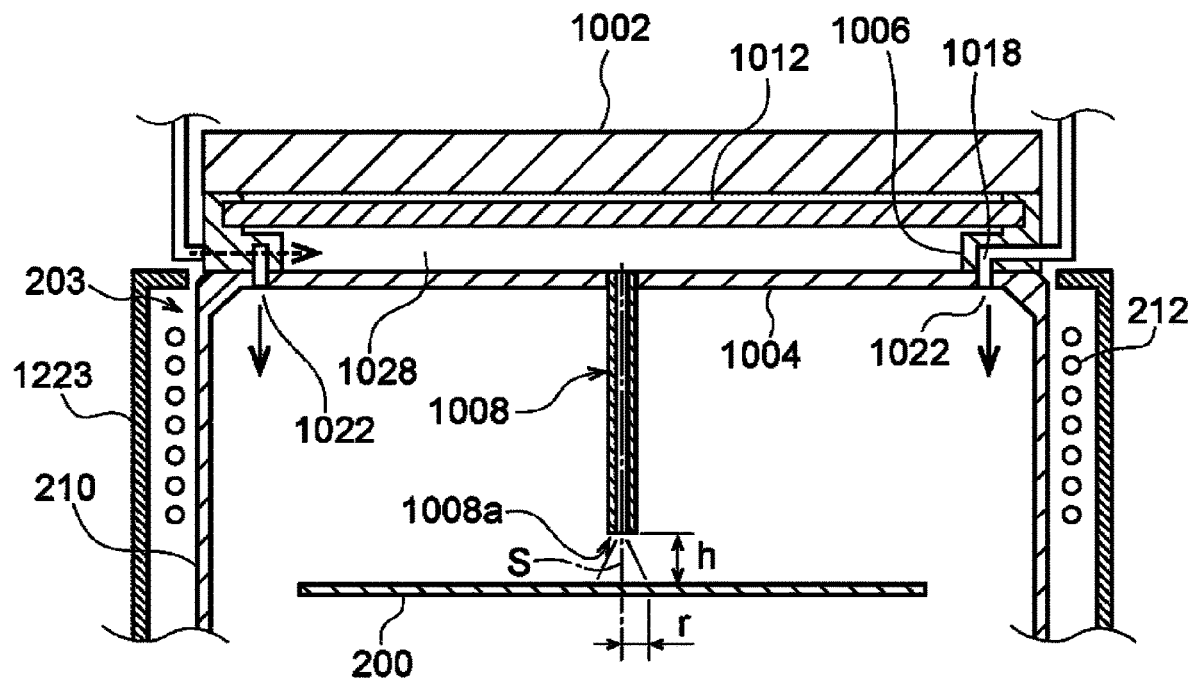
FIG. 8 is a diagram schematically illustrating a cross-section of the substrate processing apparatus according to the embodiments of the present disclosure in a case where the nozzle is provided below the plasma generation region in the substrate processing apparatus.

Alternatively, as shown in FIG. 8, the nozzle hole 1008a may be provided below the lower end of the electrode that constitutes the plasma generator 1040. Further, the nozzle hole 1008*a* may be provided below the lower end of the plasma generation region. In such a case, the susceptor 217 is controlled such that the wafer 200 supported by the susceptor 217 is located below the lower end of the electrode when the substrate processing is being performed.

Figure 6:
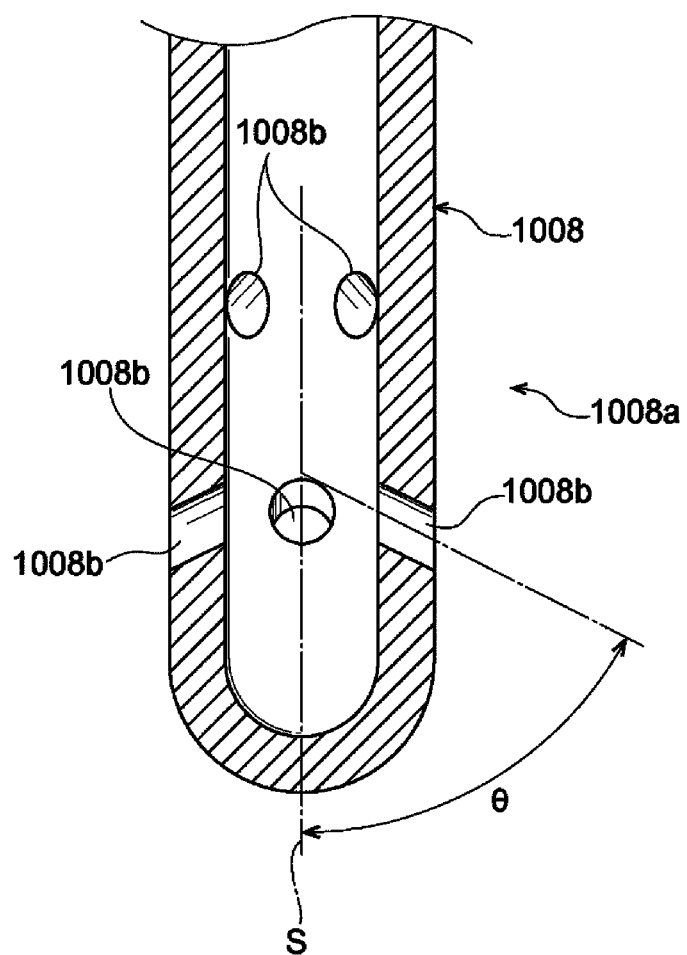
FIG. 6 is an enlarged view schematically illustrating a cross-section of another example of a nozzle.

As shown in FIG. 6, the nozzle hole 1008*a* may be constituted by a plurality of ejection ports 1008*b* provided at a front end (tip) of the nozzle 1008. For example, each of the ejection ports 1008*b* is configured such that the second process gas can be ejected obliquely downward at a predetermined angle "θ" with respect to a direction perpendicular to the surface of the wafer 200. The predetermined angle θ is set depending on a distance "h" between the nozzle hole 1008*a* and the wafer 200 such that a distance "r" can be maintained constant (see FIGS. 7 and 8). The distance r refers to a distance from a center of the wafer 200 to a position at which a line representing a direction of the second process gas ejected from the nozzle hole 1008*a* intersects with the surface of the wafer 200. As a result, the predetermined angle θ increases as the distance h between the nozzle hole 1008*a* and the surface (that is, an upper surface) of the wafer 200 decreases, and decreases as the distance h increases. By maintaining the distance r constant, it is possible to reduce the number of parameters for changing the distance h, and it is also possible to easily adjust a concentration distribution of hydrogen in the process chamber 201, which will be described later.

In the example shown in FIG. 6, the front end (lower end) of the nozzle 1008 is closed, and the plurality of ejection ports 1008*b* are provided on an outer peripheral surface of the nozzle 1008 near the front end. An angle of the ejection port 1008*b* with respect to an axial direction "S" of the nozzle 1008 is set to the predetermined angle θ described above. By setting the angle θ to be less than 90°, it is possible to directly supply the second process gas ejected from the ejection ports 1008*b* toward the surface of the wafer 200. When the angle θ is set to 90° or more, the second process gas ejected from the ejection ports 1008*b* cannot be directly supplied toward the surface of the wafer 200. Thereby, it is difficult to adjust a concentration distribution of the second process gas (more specifically, the concentration distribution of hydrogen) in a space near a processing surface (that is, the upper surface) of the wafer 200.

Further, by adjusting at least one selected from the group consisting of the distance h and the angle θ, it is possible to adjust a width of a planar region (including the processing surface of the wafer 200) to which the second process gas ejected from the ejection ports 1008*b* is directly supplied. For example, the planar region to which the second process gas is directly supplied may be a region within the processing surface of the wafer 200, and more preferably, may be a region within the processing surface of the wafer 200 excluding an outer edge of the wafer 200. By adjusting a size of the planar region to which the second process gas is directly supplied to be limited to a size of the region within the processing surface of the wafer 200, it is possible to more easily adjust the concentration distribution of the second process gas in the space near the processing surface of the wafer 200.

The nozzle hole 1008*a* is configured such that the second process gas can be directly ejected onto the wafer 200 or can be directly supplied to a space above the wafer 200. In other words, no structure such as a gas diffuser plate is provided between the nozzle hole 1008*a* and the wafer 200.

The nozzle hole 1008*a* is not limited to being provided at the front end (lower end) of the nozzle 1008. For example, the nozzle hole 1008*a* may be provided at an intermediate portion in the axial direction S of the nozzle 1008. Further, for example, a height position of the nozzle hole 1008*a* may be adjusted by changing a protrusion amount of the nozzle 1008.

For example, a gaseous mixture of the first gas and the second gas is used as the second process gas. Alternatively, the second process gas may refer to a gas containing the second gas and free of the first gas. Further, when the gas containing the first gas and free of the second gas is used as the first process gas, it is possible to adjust a concentration of hydrogen in the process chamber 201, which will be described later, with a simple configuration.

A downstream end of an oxygen-containing gas supply pipe 232*d* through which the oxygen-containing gas is supplied, a downstream end of a hydrogen-containing gas supply pipe 232*e* through which the hydrogen-containing gas is supplied and a downstream end of an inert gas supply pipe 232*f* through which the inert gas is supplied are connected to a gas introduction path 1030 so as to be conjoined with one another. An oxygen-containing gas supply source 250*d*, an MFC 252*d* and a valve 253*d* are sequentially provided at the oxygen-containing gas supply pipe 232*d*. A hydrogen-containing gas supply source 250*e*, an MFC 252*e* and a valve 253*e* are sequentially provided at the hydrogen-containing gas supply pipe 232*e*. An inert gas supply source 250*f*, an MFC 252*f* and a valve 253*f* are sequentially provided at the inert gas supply pipe 232*f*. A valve 243*c* is provided on a downstream side of a location where the oxygen-containing gas supply pipe 232*d*, the hydrogen-containing gas supply pipe 232*e* and the inert gas supply pipe 232*f* join. The valve 243*c* is connected to an upstream end the gas introduction path 1030. It is possible to supply the process gases such as the oxygen-containing gas, the hydrogen-containing gas and the inert gas into the process chamber 201 via the oxygen-containing gas supply pipe 232*d*, the hydrogen-containing gas supply pipe 232*e* and the inert gas supply pipe 232*f* by opening and closing the valves 253*d*, 253*e*, 253*f* and 243*c* while adjusting flow rates of the respective gases by the MFCs 252*d*, 252*e* and 252*f*.

The second gas supplier (which is the second gas supply structure or the second gas supply system) 1200 according to the present embodiments is constituted mainly by the nozzle 1008, the nozzle hole 1008*a*, the oxygen-containing gas supply pipe 232*d*, the hydrogen-containing gas supply pipe 232*e*, the inert gas supply pipe 232*f*, the MFCs 252*d*, 252*e* and 252*f* and the valves 253*d*, 253*e*, 253*f* and 243*c*. The second process gas supplied into the process chamber 201 through the second gas supplier 1200 functions as a hydrogen concentration adjusting gas for adjusting the concentration of hydrogen. For example, the second process gas contains hydrogen.

The first gas supplier 1100 is configured such that the first process gas can be supplied to an outer peripheral region (which is a first region within the plasma generation space 201*a* described later extending along an inner wall of the process chamber 201) through the first gas supplier 1100. Further, the second gas supplier 1200 is configured such that the second process gas can be supplied to a central region (which is a second region within the plasma generation space 201*a* and surrounded by the outer peripheral region) through the second gas supplier 1200. That is, the first process gas is supplied to the outer peripheral region in the process chamber 201, and the second process gas is supplied to the central region (which is different from the outer peripheral region in a planar direction of the wafer 200) including a region above the processing surface of the wafer 200. That is, a space in the process chamber 201 is constituted by the outer peripheral region along the inner wall of the process chamber 201 and the central region surrounded by the outer peripheral region.

According to the first gas supplier 1100 and the second gas supplier 1200, it is possible to adjust a mixing ratio (or a flow rate ratio) of the oxygen-containing gas and the hydrogen-containing gas or a total flow rate for each of the first gas and the second gas. Therefore, it is possible to adjust the mixing ratio or the total flow rate of the oxygen-containing gas and the hydrogen-containing gas supplied to each of the outer peripheral region and the central region in the process chamber 201, and more generally, a ratio or a total flow rate of oxygen and hydrogen supplied to each of the outer peripheral region and the central region in the process chamber 201.

Figure 9:
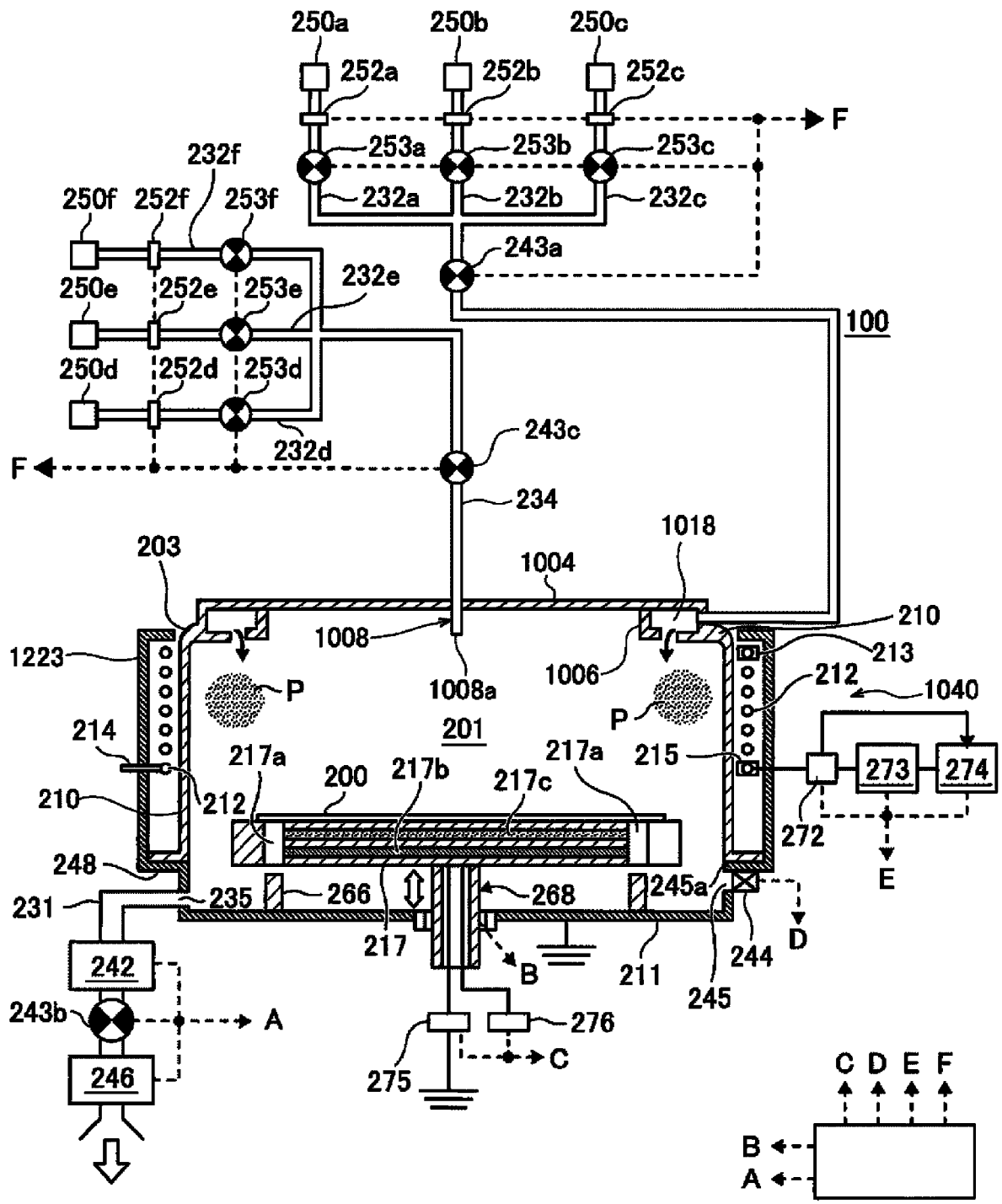
FIG. 9 is a diagram schematically illustrating a cross-section of a substrate processing apparatus according to a modified example of the embodiments of the present disclosure.

The second gas supplier 1200 is not limited to the configuration described above. For example, the configuration of the second gas supplier 1200 may be modified according to a modified example shown in FIG. 9. According to the modified example shown in FIG. 9, the plate 1004 constituting the ceiling surface of the process chamber 201 is provided, and the nozzle 1008 is connected to or penetrates through the plate 1004 such that the upper end of the nozzle 1008 is connected to a second gas supply pipe 234 through which the second gas is supplied. That is, according to the modified example shown in FIG. 9, the first buffer 1018 shown in FIG. 1 is omitted.

<Exhauster>

A gas exhaust port 235 through which a gas such as a reactive gas is exhausted out of the process chamber 201 is provided on a side wall of the lower vessel 211. An upstream end of a gas exhaust pipe 231 is connected to the gas exhaust port 235. An APC (Automatic Pressure Controller) valve 242 serving as a pressure regulator (which is a pressure adjusting structure), a valve 243b serving as an opening/closing valve and a vacuum pump 246 serving as a vacuum exhaust apparatus are provided at the gas exhaust pipe 231.

An exhauster (which is an exhaust structure or an exhaust system) according to the present embodiments is constituted mainly by the gas exhaust port 235, the gas exhaust pipe 231, the APC valve 242 and the valve 243b. The exhauster may further include the vacuum pump 246.

<Plasma Generator (ICP Method)>

The plasma generator 1040 is provided along an outer circumference of the process vessel 203. Further, the plasma generator 1040 is constituted by an electrode to which the high frequency power is supplied. It is configured. The first process gas and the second process gas supplied into the process chamber 201 are plasma-excited by the plasma generator 1040. For example, the electrode is constituted by the resonance coil 212 wound around the outer circumference of the process vessel 203. Specifically, the resonance coil 212 of a helical shape (which serves as a high frequency electrode) is provided around an outer circumference of the process chamber 201 so as to surround the process chamber 201, that is, around an outer portion of a side wall of the upper vessel 210. An RF (Radio Frequency) sensor 272, a high frequency power supply 273 and a matcher (which is a matching structure) 274 configured to perform an impedance matching or an output frequency matching for the high frequency power supply 273 are connected to the resonance coil 212.

The high frequency power supply 273 is configured to supply the high frequency power (RF power) to the resonance coil 212. The RF sensor 272 is provided at an output side of the high frequency power supply 273. The RF sensor 272 is configured to monitor information of the traveling wave or reflected wave of the supplied high frequency power. The reflected wave of the RF power monitored by the RF sensor 272 is input to the matcher 274, and the matcher 274 is configured to adjust an impedance of the high frequency power supply 273 or a frequency of the high frequency power output from the high frequency power supply 273 so as to minimize the reflected wave based on the information of the reflected wave inputted from the RF sensor 272.

A winding diameter, a winding pitch and the number of winding turns of the resonance coil 212 are set such that the resonance coil 212 resonates at a constant wavelength to form a standing wave of a predetermined wavelength. That is, an electrical length of the resonance coil 212 is set to a half ($\frac{1}{2}$) or an integral multiple of a wavelength of a predetermined frequency of the high frequency power supplied from the high frequency power supply 273.

Specifically, considering conditions such as the power to be applied, a strength of a magnetic field to be generated and a shape of an apparatus such as the substrate processing apparatus 100 to which the power is to be applied to, the resonance coil 212 whose effective cross-section is within a range from 50 mm$^2$ to 300 mm$^2$ and whose diameter is within a range from 200 mm to 500 mm is wound, for example, twice to 60 times around an outer circumference of the plasma generation space 201a such that the magnetic field of about 0.01 Gauss to about 10 Gauss can be generated by the high frequency power whose frequency is within a range from 800 kHz to 50 MHz and whose power is within a range from 0.1 KW to 5 KW. In the present specification, a notation of a numerical range such as "from 800 kHz to 50 MHz" means that a lower limit and an upper limit are included in the numerical range. Therefore, for example, a numerical range "from 800 kHz to 50 MHz" means a range equal to or higher than 800 kHz and equal to or less than 50 MHz. The same also applies to other numerical ranges described herein.

Further, both ends of the resonance coil 212 are electrically grounded. At least one end of the resonance coil 212 is grounded via a movable tap 213 in order to fine-tune the electrical length of the resonance coil 212 when the substrate processing apparatus 100 is newly installed or process conditions of the substrate processing apparatus 100 are changed, and the other end of the resonance coil 212 is grounded via a fixed ground 214 as shown in FIG. 1. Further, a position of the movable tap 213 may be adjusted in order for resonance characteristics of the resonance coil 212 to become approximately the same as those of the high frequency power supply 273. In addition, a power feeder (not shown) constituted by a movable tap 215 is provided between the grounded ends of the resonance coil 212.

A shield plate 1223 is provided as a shield against an electric field outside the resonance coil 212.

The plasma generator 1040 according to the present embodiments is constituted mainly by the resonance coil 212, the RF sensor 272 and the matcher 274. In addition, the plasma generator 1040 may further include the high frequency power supply 273.

Hereinafter, a principle of generating the plasma in the substrate processing apparatus 100 according to the present embodiments and properties of the generated plasma will be described with reference to FIG. 2. The plasma generator 1040 according to the present embodiments is configured to generate the plasma by an ICP (Inductively Coupled Plasma) method as follows.

According to the present embodiments, in order to compensate for a resonance shift in the resonance coil 212 (which occurs when the plasma is generated) by adjusting the power supplied from the high frequency power supply 273, the RF sensor 272 is configured to be capable of detecting the power of the reflected wave from the resonance coil 212 when the plasma is generated, and the matcher 274 is configured to be capable of correcting the output of the high frequency power supply 273 based on the detected power of the reflected wave.

Specifically, the matcher 274 is configured to increase or decrease the impedance or an output frequency of the high frequency power supply 273 such that the power of the reflected wave is minimized based on the power of the reflected wave from the resonance coil 212 detected by the RF sensor 272 when the plasma is generated.

Figure 2:
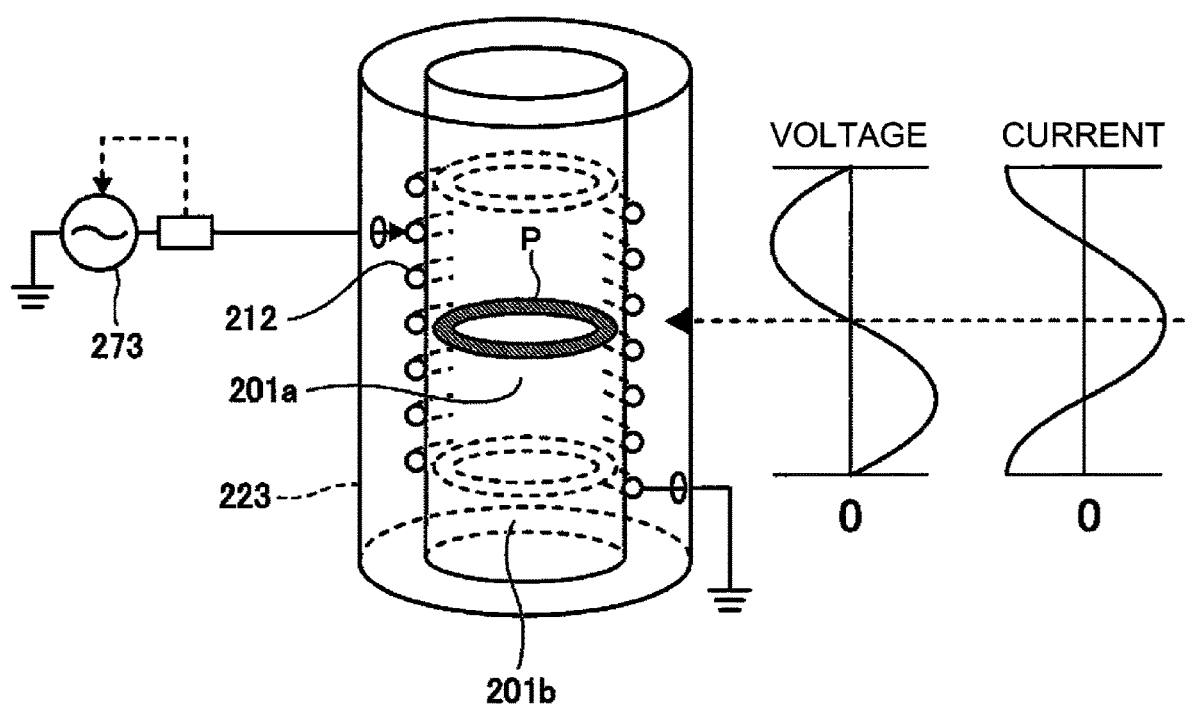
FIG. 2 is a diagram schematically illustrating a principle of generating the plasma in the substrate processing apparatus according to the embodiments of the present disclosure.

According to the present embodiments, as described above, the electrical length of the resonance coil 212 is set to a half (½) or an integral multiple of the wavelength of the predetermined frequency of the high frequency power, and as shown in FIG. 2, the high frequency power in accordance with the actual resonance frequency of the resonance coil 212 combined with the plasma is supplied to the resonance coil 212. Therefore, the standing wave in which the phase voltage thereof and the opposite phase voltage thereof are always canceled out by each other is generated in the resonance coil 212. When the electrical length of the resonance coil 212 and the wavelength of the high frequency power are the same, the highest phase current is generated at the electric midpoint of the resonance coil 212 (node of zero voltage). Therefore, a ring-shaped induction plasma whose electric potential is extremely low is generated in the vicinity of the electric midpoint of the resonance coil 212. The ring-shaped induction plasma is hardly capacitively coupled with walls of the process chamber 201 or the susceptor 217.

With such a configuration, the resonance coil 212 is provided so as to wind around the outer circumference of the process chamber 201. Therefore, by supplying the high frequency power to the resonance coil 212, the plasma P of a cylindrical shape or an annular shape is generated in the vicinity of the resonance coil 212 and in the plasma generation region provided along the inner circumference of the process vessel 203 in the process chamber 201. That is, the plasma P of the cylindrical shape or the annular shape is generated in the outer peripheral region in the process chamber 201. According to the present embodiments, in particular, the plasma P of the annular shape (hereinafter, also referred to as an "annular plasma P") is generated at a height where the electric midpoint of the resonance coil 212 is located, that is, at a middle height position between the upper end and the lower end of the resonance coil 212.

<Plasma Generator (MMT Method)>

Figure 5:
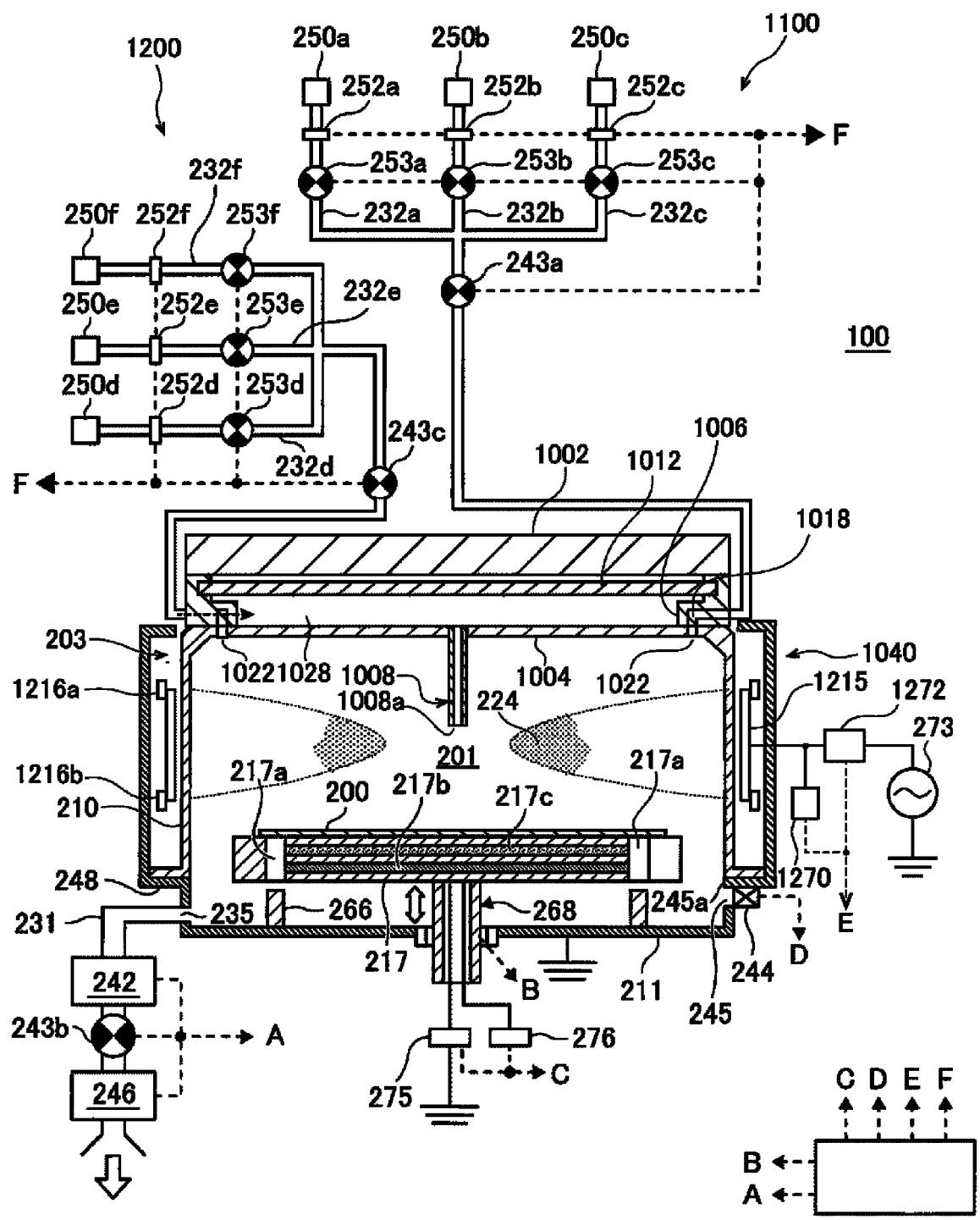
FIG. 5 is a diagram schematically illustrating a cross-section of the substrate processing apparatus according to the embodiments of the present disclosure in a case where an MMT (Modified Magnetron Typed Plasma Source) method is used to generate the plasma.

The plasma generator 1040 is not limited to the configuration using the ICP method described above. For example, the plasma generator 1040 may be configured to generate the plasma by using an MMT (Modified Magnetron Typed Plasma Source) method as shown in FIG. 5.

The high frequency power is applied to a plasma generation electrode to provide an electric field and to provide a magnetic field to generate a magnetron discharge. As a result, electrons emitted from the plasma generation electrode continue to circulate in a cycloidal motion while drifting. Thereby, it is possible to extend the lifetime of the electrons and to increase an ionization generation rate. Therefore, the plasma generator 1040 using the MMT method can generate the plasma whose density is high.

Various plasma processing can be performed by the plasma generator 1040 using the MMT method. For example, by exciting and decomposing the process gases, an oxidation process (or a nitridation process) by oxidizing (or nitriding) a surface of the substrate (that is, the wafer 200) or a film formed on the substrate, a film-forming process of forming a film on the surface of the substrate or an etching process of etching the surface of the substrate may be performed.

A plasma generation electrode 1215 of a tubular shape (for example, an annular shape or a cylindrical shape) serving as a discharge structure is provided on the outer circumference of the process vessel 203 (that is, the upper vessel 210). The plasma generation electrode 1215 surrounds a plasma generation region 224 within the process chamber 201. The high frequency power supply 273 capable of applying the high frequency power is connected to the plasma generation electrode 1215 via an impedance matcher (which is an impedance matching structure) 1272 configured to perform the impedance matching for the high frequency power supply 273. A voltage measuring structure 1270 capable of measuring a peak-to-peak voltage of the plasma generation electrode 1215 is connected between the plasma generation electrode 1215 and the impedance matcher 1272. Data such as the peak-to-peak voltage of the plasma generation electrode 1215 measured by the voltage measuring structure 1270 is output to a controller 221 described later. The plasma generator 1040 shown in FIG. 5 is constituted mainly by the plasma generation electrode 1215, the impedance matcher 1272 and the high frequency power supply 273. Further, the voltage measuring structure 1270, the impedance matcher 1272 and the high frequency power supply 273 are connected to the controller 221 described later.

An upper magnet 1216a and a lower magnet 1216b, each of which is of a tubular shape (for example, an annular shape or a cylindrical shape) and serves as a magnetic field forming structure, are provided in the vicinity of upper and lower ends of an outer surface of the plasma generation electrode 1215 such that the plasma generation electrode 1215 is interposed therebetween. For example, each of the upper magnet 1216a and the lower magnet 1216b is constituted by a permanent magnet. Magnetic poles of each of the upper magnet 1216a and the lower magnet 1216b are located at both radial ends (that is, an inner peripheral end and an outer peripheral end) along a radial direction of the process chamber 201. The upper magnet 1216a and the lower magnet 1216b are provided such that the magnetic poles thereof are directed in opposite directions. That is, the magnetic poles of the upper magnet 1216a and the lower magnet 1216b provided at the inner peripheral ends are of opposite polarities to each other. As a result, it is possible to provide (or form) magnetic lines of force in an axial direction of cylinders (that is, the upper magnet 1216a and the lower magnet 1216b) along inner peripheral surfaces of the upper magnet 1216a and the lower magnet 1216b.

<Controller>

The controller 221 serving as a control structure is configured to control the APC valve 242, the valve 243b and the vacuum pump 246 through a signal line "A", the susceptor elevator 268 through a signal line "B", a heater power regulator 276 and the variable impedance regulator 275 through a signal line "C", the gate valve 244 through a signal line "D", the RF sensor 272, the high frequency power supply 273 and the matcher 274 through a signal line "E", and the MFCs 252a through 252f and the valves 253a through 253f, 243a and 243c through a signal line "F".

Figure 3:
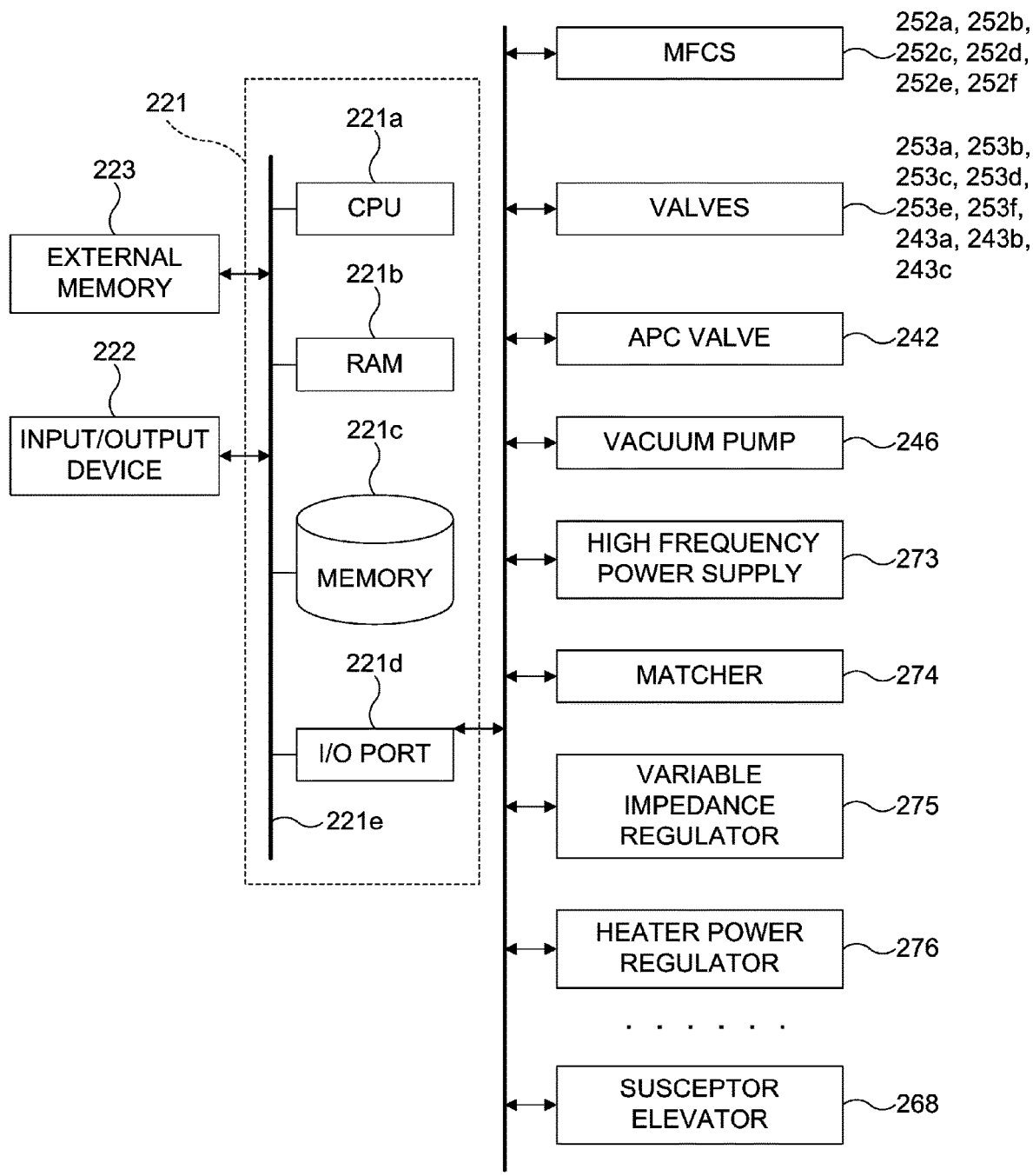
FIG. 3 is a block diagram schematically illustrating a configuration of a controller (control structure) and related components of the substrate processing apparatus according to the embodiments of the present disclosure.
Figure 4:
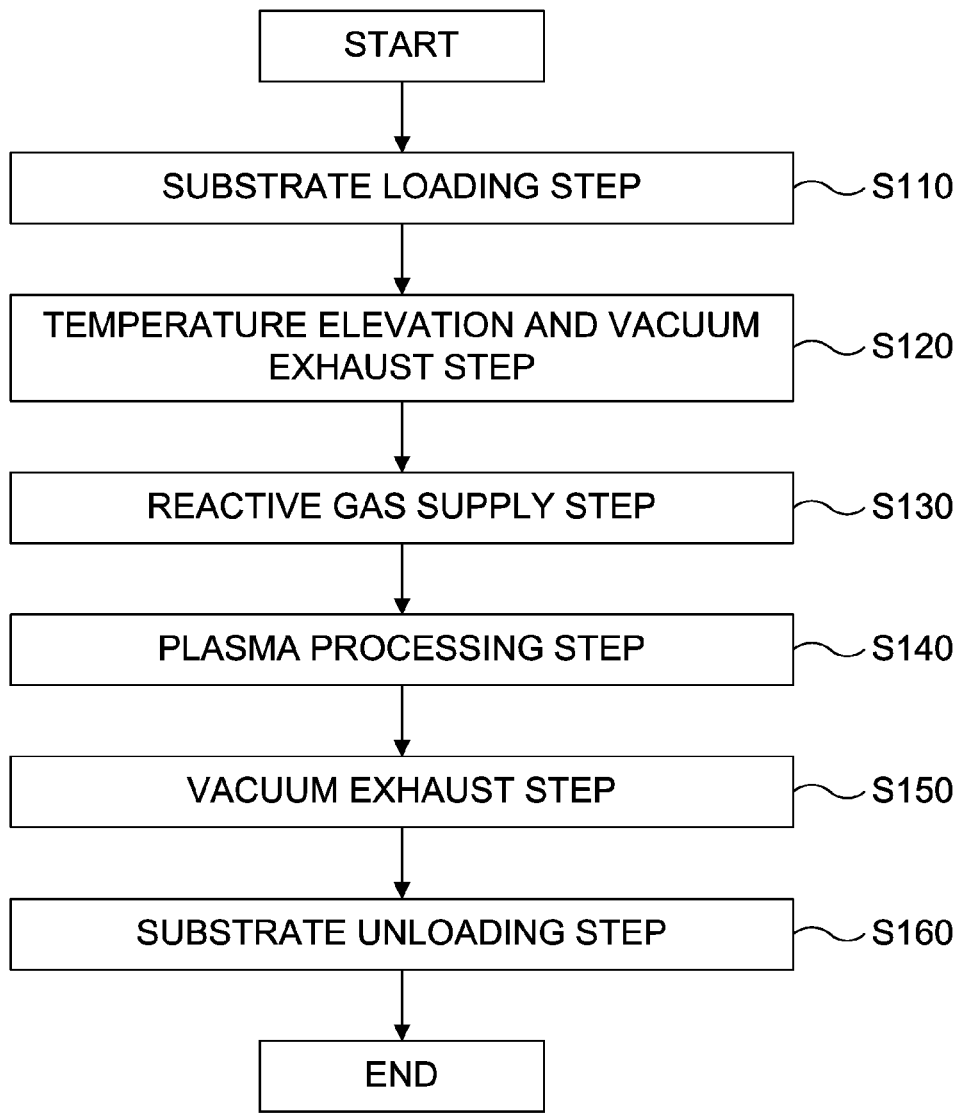
FIG. 4 is a flow chart schematically illustrating a substrate processing according to the embodiments of the present disclosure.

As shown in FIG. 3, the controller 221 serving as a control structure (control apparatus) is constituted by a computer including a CPU (Central Processing Unit) 221a, a RAM (Random Access Memory) 221b, a memory 221c and an I/O port 221d. The RAM 221b, the memory 221c and the I/O port 221d may exchange data with the CPU 221a through an internal bus 221e. For example, an input/output device 222 constituted by components such as a touch panel and a display may be connected to the controller 221.

The memory 221c may be embodied by a component such as a flash memory and a hard disk drive (HDD). For example, a control program configured to control operations of the substrate processing apparatus 100 and a process recipe in which information such as sequences and conditions of the substrate processing described later is stored may be readably stored in the memory 221c. The process recipe is obtained by combining steps of the substrate processing described later such that the controller 221 can execute the steps to acquire a predetermined result, and functions as a program. Hereinafter, the process recipe and the control program may be collectively or individually referred to as a "program". Thus, in the present specification, the term "program" may refer to the process recipe alone, may refer to the control program alone, or may refer to both of the process recipe and the control program. Further, the RAM 221b functions as a memory area (work area) where a program or data read by the CPU 221a is temporarily stored.

The I/O port 221d is electrically connected to the components described above such as the MFCs 252a through 252f, the valves 253a through 253f, 243a, 243b and 243c, the gate valve 244, the APC valve 242, the vacuum pump 246, the RF sensor 272, the high frequency power supply 273, the matcher 274, the susceptor elevator 268, the variable impedance regulator 275 and the heater power regulator 276.

The CPU 221a is configured to read and execute the control program stored in the memory 221c, and to read the process recipe stored in the memory 221c in accordance with an instruction such as an operation command inputted via the input/output device 222. The CPU 221a is configured to control the operations of the substrate processing apparatus 100 in accordance with the read process recipe. For example, the CPU 221a is configured to be capable of controlling various operations, in accordance with the process recipe, such as an operation of adjusting an opening degree of the APC valve 242, an opening and closing operation of the valve 243b and a start and stop of the vacuum pump 246 via the I/O port 221d and the signal line "A". Further, the CPU 221a is configured to be capable of controlling various operations, in accordance with the process recipe, such as an elevating and lowering operation of the susceptor elevator 268 via the I/O port 221d and the signal line "B". Further, the CPU 221a is configured to be capable of controlling various operations, in accordance with the process recipe, such as a power supply amount adjusting operation to the heater 217b by the heater power regulator 276 and an impedance value adjusting operation by the variable impedance regulator 275 via the I/O port 221d and the signal line "C". Further, the CPU 221a is configured to be capable of controlling various operations, in accordance with the process recipe, such as an opening and closing operation of the gate valve 244 via the I/O port 221d and the signal line "D". Further, the CPU 221a is configured to be capable of controlling various operations, in accordance with the process recipe, such as controlling operations of the RF sensor 272, the matcher 274 and the high frequency power supply 273 via the I/O port 221d and the signal line "E". Further, the CPU 221a is configured to be capable of controlling various operations, in accordance with the process recipe, such as flow rate adjusting operations for various gases by the MFCs 252a through 252f and opening and closing operations of the valves 253a through 253f, 243a and 243c via the I/O port 221d and the signal line "F".

The controller 221 may be embodied by installing the above-described program stored in an external memory 223 into a computer. For example, the external memory 223 may include a magnetic tape, a magnetic disk such as a flexible disk and a hard disk, an optical disk such as a CD and a DVD, a magneto-optical disk such as an MO and a semiconductor memory such as a USB memory and a memory card. The memory 221c or the external memory 223 may be embodied by a non-transitory computer readable recording medium. Hereafter, the memory 221c and the external memory 223 may be collectively or individually referred to as a "recording medium". Thus, in the present specification, the term "recording medium" may refer to the memory 221c alone, may refer to the external memory 223 alone, or may refer to both of the memory 221c and the external memory 223. The program may be provided to the computer without using the external memory 223. For example, the program may be supplied to the computer using a communication structure such as the Internet and a dedicated line.

<Method of Manufacturing Semiconductor Device>

A method of manufacturing a semiconductor device according to the present embodiments may include: a step of transferring (or loading) the wafer 200 serving as the substrate into the process chamber 201 of the substrate processing apparatus 100 (for example, a substrate loading step S110), and a step of supplying the first process gas and the second process gas to the process chamber 201 (for example, a reactive gas supply step S130) and a step of processing the wafer 200 by using the plasma (for example, a plasma processing step S140).

The substrate processing apparatus 100 may include: the process vessel 203 constituting the process chamber 201; the first gas supplier (which is the first gas supply structure or the first gas supply system) 1100 provided with the first supply port 1022 through which the first process gas is supplied into the process chamber 201; the second gas supplier (which is the second gas supply structure or the second gas supply system) 1200 provided with the nozzle hole 1008a (which is the second supply port) through which the second process gas, whose composition is different from that of the first process gas, is supplied into the process chamber 201; the plasma generator 1040 provided along the outer circumference of the process vessel 203, constituted by the electrode to which the high frequency power is supplied, and configured to be capable of plasma-exciting the first process gas supplied into the process chamber 201; and the susceptor 217 (which is the substrate mounting table) on which the wafer 200 serving as the substrate is placed. The nozzle hole 1008a is provided at the nozzle 1008 extending downward from a position in the ceiling surface of the process chamber 201 located closer to a radial center of the process vessel 203 (more specifically, a center of the ceiling surface of the process chamber 201) than the first supply port 1022, and is provided below the first supply port 1022.

(2) Substrate Processing

Subsequently, the substrate processing according to the present embodiments (which is a part of a manufacturing process of a semiconductor device such as a flash memory and which is performed by using the substrate processing apparatus 100 described above) will be described. The substrate processing will be described by way of an example in which a method of forming a silicon oxide film (hereinafter, also referred to as an "SiO film") by oxidizing the surface of the wafer 200 on which a silicon-containing film is formed is performed. In the following description, operations of components constituting the substrate processing apparatus 100 are controlled by the controller 221.

<Substrate Loading Step S110>

First, the wafer 200 is transferred (or loaded) into the process chamber 201 and accommodated therein. Specifically, the susceptor 217 is lowered to a position of transferring the wafer 200 by the susceptor elevator 268. As a result, the wafer lift pins 266 protrude from the through-holes 217a by a predetermined height above the surface of the susceptor 217.

Subsequently, the gate valve 244 is opened, and the wafer 200 is transferred into the process chamber 201 using a wafer transfer structure (not shown) from a vacuum transfer chamber (not shown) provided adjacent to the process chamber 201. The wafer 200 loaded into the process chamber 201 is placed on and supported by the wafer lift pins 266 in a horizontal orientation. After the wafer 200 is loaded into the process chamber 201, the gate valve 244 is closed to hermetically seal (or close) an inside of the process chamber 201. Thereafter, by elevating the susceptor 217 using the susceptor elevator 268, the wafer 200 is placed on and supported by an upper surface of the susceptor 217.

<Temperature Elevation and Vacuum Exhaust Step S120>

Subsequently, a temperature of the wafer 200 loaded into the process chamber 201 is elevated. The heater 217b is heated in advance, and the wafer 200 is heated to a predetermined temperature (for example, a temperature within a range from 150° C. to 750° C.) by placing the wafer 200 on the susceptor 217 where the heater 217b is embedded. The process chamber 201 is also heated by the lamp heater 1002. Further, while the wafer 200 is being heated, the vacuum pump 246 vacuum-exhausts an inner atmosphere of the process chamber 201 through the gas exhaust pipe 231 such that an inner pressure of the process chamber 201 reaches and is maintained at a predetermined pressure. The vacuum pump 246 is continuously operated at least until a substrate unloading step S160 described later is completed.

<Reactive Gas Supply Step S130>

Subsequently, a supply of the gaseous mixture (which serves as the first process gas containing oxygen, that is, an oxidizing species gas) of the oxygen-containing gas and the hydrogen-containing gas to the outer peripheral region of the process chamber 201 through the first gas supplier 1100 is started. Specifically, the valves 253a and 253b are opened, and a supply of the first process gas into the process chamber 201 through the first supply port 1022 is started while flow rates of the oxygen-containing gas and the hydrogen-containing gas (that is, a flow rate of the first process gas) is adjusted by the MFCs 252a and 252b, respectively.

By controlling the flow rates by the MFC 252a and the MFC 252b, it is possible to adjust at least one of a total flow rate of the first process gas or a composition of the first process gas (especially, a hydrogen content in the first process gas). According to the present embodiments, it is possible to easily adjust the composition of the first process gas by changing the mixing ratio (or the flow rate ratio) of the hydrogen-containing gas and the oxygen-containing gas.

In the reactive gas supply step S130, for example, when 02 gas is used as the oxygen-containing gas and $H_2$ gas is used as the hydrogen-containing gas, the total flow rate of the first process gas is set be a predetermined flow rate, for example, within a range from 1,000 sccm to 10,000 sccm, and the flow rate of the oxygen-containing gas in the first process gas is set be a predetermined flow rate, for example, within a range from 20 sccm to 4,000 sccm, preferably within a range from 20 sccm to 2,000 sccm. Further, the flow rate of the hydrogen-containing gas in the first process gas is set be a predetermined flow rate, for example, within a range from 20 sccm to 1,000 sccm, preferably within a range from 20 sccm to 500 sccm. For example, a content ratio of hydrogen and oxygen contained in the first process gas is set to be a predetermined value within a range from 0:100 to 95:5.

It is preferable to supply the first process gas directly to the outer peripheral region of the process chamber 201 where the ring-shaped plasma is generated in the plasma processing step S140 described later.

Simultaneously, a supply of the gaseous mixture (which serves as the second process gas, that is, the hydrogen concentration adjusting gas) of the oxygen-containing gas and the hydrogen-containing gas to the central region of the process chamber 201 through the second gas supplier 1200 is started. Specifically, the valves 253d and 253e are opened, and a supply of the second process gas into the process chamber 201 through the nozzle hole 1008a provided at the nozzle 1008 is started while flow rates of the oxygen-containing gas and the hydrogen-containing gas (that is, a flow rate of the second process gas) is adjusted by the MFCs 252d and 252e, respectively.

By controlling the flow rates by the MFC 252d and the MFC 252e, it is possible to adjust at least one of a total flow rate of the second process gas or a composition of the second process gas (especially, a hydrogen content in the second process gas). Similar to the first process gas, it is possible to easily adjust the composition of the second process gas by changing the mixing ratio (or the flow rate ratio) of the oxygen-containing gas and the hydrogen-containing gas.

In the reactive gas supply step S130, for example, when the $O_2$ gas is used as the oxygen-containing gas and the $H_2$ gas is used as the hydrogen-containing gas, the total flow rate of the second process gas is set be equal to or less than the total flow rate of the first process gas. For example, the total flow rate of the second process gas is set be a predetermined flow rate, for example, within a range from 100 sccm to 5,000 sccm, and the flow rate of the oxygen-containing gas in the second process gas is set be a predetermined flow rate, for example, within a range from 0 sccm to 5,000 sccm, preferably within a range from 0 sccm to 500 sccm. Further, the flow rate of the hydrogen-containing gas in the second process gas is set be a predetermined flow rate, for example, within a range from 0 sccm to 5,000 sccm, preferably within a range from 0 sccm to 500 sccm. According to the present embodiments, a ratio of the hydrogen-containing gas contained in the second process gas (that is, the hydrogen content of the second process gas) is set to be a predetermined value within a range from 0% to 100%. When the flow rate of the second process gas is higher than the flow rate of the first process gas, concentrations and content ratios of hydrogen and oxygen in the plasma generation region within the process chamber 201 are greatly affected by the second process gas. As a result, it becomes difficult to control the plasma excitation in the plasma generation region or to control a generation of the oxidizing species generated by the plasma.

That is, according to the present embodiments, the controller 221 controls at least the MFCs 252a, 252b, 252d and 252e to adjust at least one of a concentration ratio of the first gas and the second gas in each of the first process gas and the second process gas, or a flow rate ratio of the first process gas and the second process gas.

According to the present embodiments, by supplying the second process gas containing hydrogen through the nozzle hole 1008*a*, when performing a process on the surface of the wafer 200 with an active species generated by the plasma excitation, it is possible to easily adjust a distribution formed by the process on the surface of the substrate (that is, the wafer 200). In other words, it is possible to improve a controllability of the distribution on the surface of the substrate.

For example, when a bias of a density of the plasma generated in the process chamber 201 is formed (in particular, when the bias of the density of the plasma in a radial direction is formed around the center of the process chamber 201), it is possible to easily adjust (specifically, to easily reduce) a bias of the distribution formed by the process on the surface of the wafer 200 due to the bias of the density of the plasma.

Further, by providing the nozzle 1008 so as to extend downward from the plate 1004 constituting the ceiling surface of the process chamber 201, even when the electrode (for example, the resonance coil 212) of the plasma generator 1040 is arranged around the process vessel 203, there is no interference between the nozzle 1008 and the electrode. Therefore, an apparatus design becomes easier.

An optimal value of a length of the nozzle 1008 provided with the nozzle hole 1008*a* (that is, the distance from the nozzle hole 1008*a* to the wafer 200) may vary depending on factors such as the flow rate of the second process gas, the inner pressure of the process chamber 201 (which is a process pressure) and a value of the RF power or depending on a distribution of the plasma processing on the surface of the substrate. According to the present embodiments, by changing the length of the nozzle 1008, it is possible to adjust the distribution of the plasma processing on the surface of the substrate.

The longer the nozzle 1008 (that is, the shorter the distance to the wafer 200), the smaller an influence of the supply of the second process gas on the flow of the first process gas supplied through the first supply port 1022 in the process chamber 201. Further, by reducing the distance between the nozzle hole 1008*a* and the surface of the wafer 200, it is possible to easily adjust a distribution of the gas in a space near the wafer 200 by using the gas supplied through the nozzle hole 1008*a*. In order to obtain the effects described above, in particular, it is preferable that the nozzle hole 1008*a* is provided below the lower end of the electrode that constitutes the plasma generator 1040, or below the lower end of the plasma generation region.

On the other hand, the shorter the nozzle 1008 (that is, the longer the distance to the wafer 200), the greater the influence of the supply of the second process gas on the flow of the first process gas supplied through the first supply port 1022 in the process chamber 201. Therefore, in order to adjust the flow of the first process gas in the process chamber 201 by the supply of the second process gas, the nozzle 1008 may be shortened. In order to obtain the effects described above, in particular, it is preferable that the nozzle hole 1008*a* is provided above the upper end of the electrode that constitutes the plasma generator 1040, or above the upper end of the plasma generation region.

Further, the nozzle hole 1008*a* may be provided between the upper end and the lower end of the electrode that constitutes the plasma generator 1040, or may be provided between the upper end and the lower end of the plasma generation region. By providing the nozzle hole 1008*a* as described above, it is possible to prevent (or suppress) the second process gas from being directly supplied to the plasma generation region. Thereby, it is also possible to easily control a generation state of the active species in the plasma generation region. Furthermore, the nozzle hole 1008*a* may be provided at substantially the same height as the midpoint of the resonance coil 212 that constitutes the plasma generator 1040. By providing the nozzle hole 1008*a* as described above, it is possible to prevent (or suppress) the second process gas from being directly supplied to the plasma generation region where the density of the plasma is the highest. Thereby, it is also possible to easily control the generation state of the active species in the plasma generation region.

<Control of Concentration Distribution of Hydrogen>

In the present step, by controlling at least one of the flow rate or the hydrogen content of each of the first process gas and the second process gas, it is possible to control the concentration distribution of hydrogen in the process chamber 201, in particular in the space near the processing surface of the wafer 200. The concentration distribution of hydrogen is controlled such that a density distribution of the oxidizing species in the plasma processing step S140 described later becomes a desired density distribution. The hydrogen content of the second process gas is preferably adjusted to be different from the hydrogen content of the first process gas. By using the second process gas whose hydrogen content is different from that of the first process gas, it is possible to individually control the flow rates of the first process gas and the second process gas. Thereby, it is also possible to easily control the concentration distribution of hydrogen in the process chamber 201. The hydrogen content of the second process gas may be adjusted to be higher than the hydrogen content of the first process gas, or may be adjusted to be lower than the hydrogen content of the first process gas.

For example, the inner atmosphere of the process chamber 201 is exhausted by adjusting the opening degree of the APC valve 242 such that the inner pressure of the process chamber 201 reaches and is maintained at a predetermined pressure, for example, within a range from 5 Pa to 260 Pa. The first process gas and the second process gas are continuously supplied into the process chamber 201 while the inner atmosphere of the process chamber 201 is appropriately exhausted until the plasma processing step S140 described later is completed.

<Plasma Processing Step S140>

When the inner pressure of the process chamber 201 is stabilized, the high frequency power is supplied to the resonance coil 212 from the high frequency power supply 273. Thereby, a high frequency electric field is formed in the plasma generation space 201*a* to which the first process gas is supplied, and the ring-shaped induction plasma whose density of the plasma is the highest is excited by the high frequency electric field at a height corresponding to the electric midpoint of the resonance coil 212 in the plasma generation space 201*a*. The first process gas containing oxygen and hydrogen is plasma-excited and dissociates. As a result, the active species containing oxygen such as oxygen radicals containing oxygen, hydroxyl radicals (OH radicals), atomic oxygen (O), ozone ($O_3$) and oxygen ions can be generated. The active species containing oxygen acts as the oxidizing species.

In the present step, the first process gas is supplied to the plasma generation region (which is a region where the plasma is generated with a second plasma density). According to the present embodiments, the first process gas is supplied to the plasma generation region (which is the region in which the ring-shaped plasma is excited and which is located in the outer peripheral region of the process chamber 201 near the resonance coil 212). Thereby, the active species described above can be generated mainly by the plasma excitation of the first process gas.

On the other hand, in the present step, the second process gas is supplied to a region where the plasma is generated at a first plasma density lower than the second plasma density or a plasma non-generation region which is a region where the plasma is not generated (that is, a region where the first plasma density is substantially zero (0)). That is, the second process gas is supplied to a region whose plasma density is different from that of the first process gas. According to the present embodiments, in particular, the second process gas is supplied to the plasma non-generation region provided inside the ring-shaped plasma.

That is, according to the present embodiments, at least a part of the outer peripheral region of the process chamber 201 serves as the plasma generation region in which the ring-shaped plasma is generated along the inner wall of the process chamber 201, and the central region of the process chamber 201 serves as the plasma non-generation region.

<Control of Density Distribution of Active Species>

In the present step, the active species containing oxygen generated by the plasma may lose or deteriorate in its ability (that is, may be deactivated) as the oxidizing species (or an oxidizing ability) when reacting with hydrogen in an atmosphere where the active species is present. Therefore, an attenuation rate (or an attenuation amount) of a density (or a concentration) of the active species in the atmosphere may change according to the concentration of hydrogen in the atmosphere where the active species is present. The higher the concentration of hydrogen, the greater the attenuation amount of the active species, and the lower the concentration of hydrogen, the lower the attenuation amount of the active species.

According to the present embodiments, when the active species generated in the plasma generation region diffuses in the plasma non-generation region, the active species may react with hydrogen in the plasma non-generation region and can be gradually deactivated. Therefore, it is possible to adjust the density of the active species diffusing in the plasma non-generation region (that is, the attenuation amount of the active species) by the concentration of hydrogen in the plasma non-generation region. That is, it is possible to appropriately adjust the density distribution of the active species in the plasma non-generation region by controlling the concentration distribution of hydrogen in the plasma non-generation region.

Specifically, by adjusting at least one of the flow rate or the hydrogen content of the second process gas mainly supplied to the plasma non-generation region in the reactive gas supply step S130 described above, it is possible to control the concentration distribution of hydrogen on the surface of the wafer 200 in a direction corresponding to the surface of the wafer 200 within the plasma non-generation region. Further, by controlling the concentration distribution of hydrogen, it is possible to adjust the density distribution of the active species diffused in the space above the wafer 200. Thereby, it is possible to supply the active species to the surface of the wafer 200 in a state where the density distribution of the active species is adjusted in the direction corresponding to the surface of the wafer 200.

The concentration distribution of hydrogen in the plasma non-generation region may be controlled in accordance with a distance from the plasma generation region, more specifically, a distance from a region in which the ring-shaped plasma is generated in a direction from the outer circumference of the process chamber 201 to the center of the process chamber 201.

The active species generated by the ring-shaped plasma formed in the outer peripheral region of the process chamber 201 is supplied to the wafer 200 while diffusing in an upper region (upper space) of the processing surface of the wafer 200 from an outer circumference of the wafer 200 toward the center of the wafer 200. According to the present embodiments, the ring-shaped plasma is generated with a substantially uniform density (intensity) in an inner peripheral direction of the process chamber 201, and the density of the active species generated by the plasma can be regarded as substantially uniform in the inner peripheral direction of the process chamber 201. Therefore, by forming a gradient in the concentration distribution of the hydrogen according to the distance from the plasma generation region in the radial direction of the process chamber 201 (that is, a radial direction of the wafer 200), it is possible to uniformize the density distribution of the active species in the inner peripheral direction of the process chamber 201, and it is also possible to control the density distribution of the active species in the direction corresponding to the surface of the wafer 200 to an appropriate distribution.

In addition, according to the present embodiments, a type of the active species whose density distribution is controlled is not particularly limited. The present embodiments can be preferably applied to control a density distribution of the oxygen radicals or the atomic oxygen that diffuses in the process chamber 201 without being accelerated by an electromagnetic field.

After a predetermined process time has elapsed (for example, 10 seconds to 900 seconds), a supply of the high frequency power from the high frequency power supply 273 is stopped to stop a plasma discharge in the process chamber 201. In addition, the valves 253a, 253b, 253d and 253e are closed to stop the supply of the first process gas and the supply of the second process gas into the process chamber 201. Thereby, the plasma processing step S140 is completed.

<Vacuum Exhaust Step S150>

After the supply of the first process gas and the supply of the second process gas are stopped, the inner atmosphere of the process chamber 201 is vacuum-exhausted through the gas exhaust pipe 231. As a result, the gas in the process chamber 201 such as the first process gas, the second process gas and an exhaust gas generated by a reaction between the first process gas and the second process gas is exhausted out of the process chamber 201. Thereafter, the opening degree of the APC valve 242 is adjusted such that the inner pressure of the process chamber 201 is adjusted to the same pressure as that of the vacuum transfer chamber (not shown) provided adjacent to the process chamber 201.

<Substrate Unloading Step S160>

Thereafter, the susceptor 217 is lowered to the position of transferring the wafer 200 until the wafer 200 is supported by the wafer lift pins 266. Then, the gate valve 244 is opened, and the wafer 200 is transferred (unloaded) out of the process chamber 201 by using the wafer transfer structure (not shown). Thereby, the substrate processing according to the present embodiments is completed.

OTHER EMBODIMENTS OF PRESENT DISCLOSURE

While the technique of the present disclosure is described in detail by way of the embodiments described above, the technique of the present disclosure is not limited thereto.

The technique of the present disclosure may be modified in various ways without departing from the scope thereof.

According to some embodiments of the present disclosure, it is possible to obtain the desired distribution in the surface of the substrate by performing the plasma processing.

What is claimed is:

1. A substrate processing apparatus comprising:
    a process vessel provided in a process chamber;
    a first gas supplier provided with a first supply port through which a first process gas is supplied into the process chamber;
    a second gas supplier provided with a second supply port through which a second process gas is supplied into the process chamber;
    a plasma generator provided along an outer circumference of the process vessel, and configured to be capable of plasma-exciting the first process gas supplied into the process chamber by an electrode to which a high frequency power is supplied;
    a substrate mounting table on which a substrate is placed;
    a lid disposed above the process chamber;
    a second buffer provided below the lid and to which the second process gas is supplied; and
    a plate provided below the lid and between the process chamber and the second buffer to which the second process gas is supplied,
    wherein the second supply port is provided at a supply pipe extending downward from a position in the plate located closer to a radial center of the process vessel than the first supply port, and the second supply port is provided below the first supply port, and
    wherein an upper end of the supply pipe is connected to the second buffer.

2. The substrate processing apparatus of claim 1, wherein the electrode comprises a resonance coil wound around the outer circumference of the process vessel.

3. The substrate processing apparatus of claim 2, wherein an electrical length of the resonance coil is set to a half (½) or an integral multiple of a wavelength of the high frequency power supplied to the resonance coil.

4. The substrate processing apparatus of claim 1, wherein the plasma generator is configured to be capable of generating a plasma in a plasma generation region of a cylindrical shape or of an annular shape provided along an inner circumference of the process vessel in the process chamber, and
    wherein the second supply port is provided so as to be located radially more inward of the process vessel than an inner circumference of the plasma generation region.

5. The substrate processing apparatus of claim 1,
    wherein the supply pipe penetrates the plate such that the upper end of the supply pipe is connected to a second gas supply pipe through which the second process gas is supplied.

6. The substrate processing apparatus of claim 1, further comprising
    a first buffer provided in a region along a radially outer periphery of the process vessel and to which the first process gas is supplied, and
    wherein the first supply port is in communication with the first buffer, and is provided along a circumferential direction of the process vessel.

7. The substrate processing apparatus of claim 1, wherein the second supply port is provided between an upper end and a lower end of the electrode.

8. The substrate processing apparatus of claim 2, wherein the second supply port is located at a substantially same height as a midpoint of the resonance coil.

9. The substrate processing apparatus of claim 1, wherein the second supply port is provided below a lower end of the electrode.

10. The substrate processing apparatus of claim 1, wherein the second supply port comprises a plurality of ejection ports provided at a front end of the supply pipe.

11. The substrate processing apparatus of claim 1, wherein the second supply port comprises an ejection port, and the ejection port is configured such that the second process gas is capable of being ejected obliquely downward at a predetermined angle with respect to a direction perpendicular to a surface of the substrate.

12. The substrate processing apparatus of claim 11, wherein the predetermined angle is set depending on a distance between the second supply port and the substrate such that a distance from a center of the substrate to a position at which a line representing a direction of the second process gas ejected from the second supply port intersects with the surface of the substrate is capable of being maintained constant.

13. The substrate processing apparatus of claim 1, wherein a composition of the second process gas is different from that of the first process gas.

14. The substrate processing apparatus of claim 1, wherein each of the first process gas and the second process gas is a gaseous mixture of a first gas and a second gas.

15. The substrate processing apparatus of claim 14, wherein the first gas comprises an oxygen-containing gas.

16. The substrate processing apparatus of claim 14, wherein the second gas comprises at least one selected from the group consisting of a hydrogen-containing gas and an inert gas.

17. The substrate processing apparatus of claim 13, wherein the first process gas comprises a first gas and is free of a second gas, and the second process gas comprises the second gas and is free of the first gas.

18. A method of manufacturing a semiconductor device, comprising:
    (a) loading a substrate into a process chamber of a substrate processing apparatus, wherein the substrate processing apparatus comprising:
        a process vessel provided in the process chamber;
        a first gas supplier provided with a first supply port through which a first process gas is supplied into the process chamber;
        a second gas supplier provided with a second supply port through which a second process gas is supplied into the process chamber;
        a plasma generator provided along an outer circumference of the process vessel, and comprising an electrode to which a high frequency power is supplied;
        a substrate mounting table on which the substrate is placed;
        a lid disposed above the process chamber;
        a second buffer provided below the lid and to which the second process gas is supplied; and
        a plate provided below the lid and between the process chamber and the second buffer to which the second process gas is supplied,
        wherein the second supply port is provided at a supply pipe extending downward from a position in the plate located closer to a radial center of the process vessel than the first supply port, and the second supply port is provided below the first supply port, and wherein an upper end of the supply pipe is connected to the second buffer;

(b) supplying the first process gas to the process chamber through the first supply port and supplying the second process gas to the process chamber through the second supply port;

(c) plasma-exciting the first process gas supplied into the process chamber by the plasma generator; and (d) processing the substrate by supplying the first process gas plasma-excited by the plasma generator and the second process gas to the substrate.

19. A non-transitory computer-readable recording medium storing a program that causes a substrate processing apparatus, by a computer to perform:

(a) loading a substrate into a process chamber of the substrate processing apparatus, wherein the substrate processing apparatus comprising:

a process vessel provided in the process chamber;

a first gas supplier provided with a first supply port through which a first process gas is supplied into the process chamber;

a second gas supplier provided with a second supply port through which a second process gas is supplied into the process chamber;

a plasma generator provided along an outer circumference of the process vessel, and comprising an electrode to which a high frequency power is supplied;

a substrate mounting table on which the substrate is placed;

a lid disposed above the process chamber;

a second buffer provided below the lid and to which the second process gas is supplied; and a plate provided below the lid and between the process chamber and the second buffer to which the second process gas is supplied, wherein the second supply port is provided at a supply pipe extending downward from a position in the plate located closer to a radial center of the process vessel than the first supply port, and the second supply port is provided below the first supply port, and wherein an upper end of the supply pipe is connected to the second buffer;

(b) supplying the first process gas to the process chamber through the first supply port and supplying the second process gas to the process chamber through the second supply port;

(c) plasma-exciting the first process gas supplied into the process chamber by the plasma generator; and (d) processing the substrate by supplying the first process gas plasma-excited by the plasma generator and the second process gas to the substrate.

\* \* \* \* \*